(12) United States Patent
Feng et al.

(10) Patent No.: US 10,771,022 B2
(45) Date of Patent: Sep. 8, 2020

(54) CIRCUITRY AND METHOD FOR GAN DEVICE

(71) Applicant: Alcatel Lucent, Nozay (FR)

(72) Inventors: Baoliang Feng, Shanghai (CN); Jingjing Shi, Shanghai (CN); Zaiqing Li, Shanghai (CN)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 16/094,338

(22) PCT Filed: Apr. 19, 2017

(86) PCT No.: PCT/IB2017/000612
§ 371 (c)(1),
(2) Date: Oct. 17, 2018

(87) PCT Pub. No.: WO2017/182884
PCT Pub. Date: Oct. 26, 2017

(65) Prior Publication Data
US 2019/0123695 A1    Apr. 25, 2019

(30) Foreign Application Priority Data

Apr. 19, 2016   (CN) .......................... 2016 1 0244196

(51) Int. Cl.
*H03G 3/30*   (2006.01)
*H03F 1/52*   (2006.01)
(Continued)

(52) U.S. Cl.
CPC ............. *H03F 1/523* (2013.01); *H03F 1/305* (2013.01); *H03F 3/19* (2013.01); *H03F 3/2171* (2013.01);
(Continued)

(58) Field of Classification Search
CPC .................................. H03G 3/30; H03F 3/20
(Continued)

(56) References Cited

U.S. PATENT DOCUMENTS 3,708,756 A * 1/1973 Fajen .................... H03F 1/0261
  330/296
5,745,009 A * 4/1998 Leroux ................. H03F 3/1935
  330/277
(Continued)

FOREIGN PATENT DOCUMENTS

CN   101860328 A   10/2010
CN   102684615 A   9/2012
(Continued)

OTHER PUBLICATIONS

PCT Patent Application No. PCT/IB2017/000612, Written Opinion of the International Searching Authority, dated Sep. 8, 2017, 6 pages.
(Continued)

*Primary Examiner* — Henry Choe
(74) *Attorney, Agent, or Firm* — Fay Sharpe LLP

(57) ABSTRACT

Embodiments of the present disclosure provide circuitry and a method for a gallium nitride (GaN) device. The circuitry includes a negative bias circuit configured to provide a negative bias voltage for a gate of the GaN device; a drain switch circuit configured to turn on or off a positive voltage for a drain of the GaN device; and a control circuit configured to control the drain switch circuit based on provision of the negative bias voltage, such that the positive voltage for the drain is turned on after a voltage of the gate reaches the negative bias voltage and turned off before the negative bias voltage completely disappears.

20 Claims, 14 Drawing Sheets

(51) Int. Cl.
 *H03F 1/30* (2006.01)
 *H03F 3/19* (2006.01)
 *H03F 3/217* (2006.01)

(52) U.S. Cl.
 CPC ...... *H03F 2200/15* (2013.01); *H03F 2200/18* (2013.01); *H03F 2200/27* (2013.01); *H03F 2200/451* (2013.01)

(58) Field of Classification Search
 USPC .................................................. 330/285, 296
 See application file for complete search history.

(56) References Cited

U.S. PATENT DOCUMENTS

| | | | |
|---|---|---|---|
| 5,760,652 A | | 6/1998 | Maemura et al. |
| 5,982,216 A | * | 11/1999 | Draxelmayr ........ H01L 27/0248 257/373 |
| 7,688,133 B2 | * | 3/2010 | Yamamoto ............ H03F 1/0261 330/296 |
| 2014/0300422 A1 | | 10/2014 | Okajima |

FOREIGN PATENT DOCUMENTS

| | | |
|---|---|---|
| CN | 102684712 A | 9/2012 |
| CN | 103368750 A | 10/2013 |
| CN | 103999361 A | 8/2014 |
| JP | 9238030 A | 9/1997 |
| WO | WO 00/08773 A2 | 2/2000 |

OTHER PUBLICATIONS

Cheema N. et al., "Design and implementation of bias sequence circuits for GaN HEMP amplifiers both pulsed and CW applications," 10$^{th}$ International Bhurban Conference on Applied Sciences and Technology (IBCAST), IEEE, pp. 420-423, XP032390753, 2013.

International Search Report for PCT/IB2017/000612 dated Sep. 8, 2017.

Sam Davis, GaN Basics: FAQs, Power Electronics, https://www.powerelectronics.com/print/content/21863347, Oct. 2, 2013, 10 pages.

English Bibliography for Chinese Patent Application No. CN101860328A, Published Oct. 13, 2010, Printed from Derwent Innovation on Mar. Apr. 2, 2020, 5 pages.

English Bibliography for Chinese Patent Application No. CN102684615A, Published Sep. 19, 2012, Printed from Derwent Innovation on Mar. Apr. 2, 2020, 5 pages.

English Bibliography for Chinese Patent Application No. CN102684712A, Published Sep. 19, 2012, Printed from Derwent Innovation on Mar. Apr. 2, 2020, 5 pages.

English Bibliography for Chinese Patent Application No. CN103368750A, Published Oct. 23, 2013, Printed from Derwent Innovation on Mar. Apr. 2, 2020, 5 pages.

English Bibliography for Chinese Patent Application No. CN103999361A, Published Aug. 20, 2014, Printed from Derwent Innovation on Mar. Apr. 2, 2020, 5 pages.

English Bibliography for Japanese Patent Application No. JP9238030A, Published Sep. 9, 1997, Printed from Derwent Innovation on Mar. Apr. 2, 2020, 3 pages.

* cited by examiner

CIRCUITRY AND METHOD FOR GAN DEVICE

FIELD

Embodiments of the present disclosure generally relate to circuits and operations associated with a transistor, and more particularly, to circuitry and a method for a GaN device.

BACKGROUND

Gallium nitride (GaN) is a novel radio frequency (RF) power transistor and has lots of advantages. However, a GaN RF transistor needs a negative bias voltage and a high drain voltage. In order to enable a GaN RF power amplifier to work safely, several problems as listed below need to be solved.

First, upon powering on, an accurate negative bias voltage needs to be applied to the bias circuit, then a high positive voltage is applied to the drain of the GaN power transistor, and finally an RF signal is turned on. Otherwise, the GaN power transistor will be damaged in the power-on stage. Second, upon powering off, the RF signal needs to be firstly turned off, then the high positive voltage on the drain of the GaN power transistor is switched off, and finally the negative bias voltage is disconnected. Otherwise, the GaN power transistor will be damaged in the power-off stage.

Third, the negative bias voltage needs to provide a sufficient large current, otherwise the GaN power transistor will be damaged when overdriven, which usually takes place in a mobile communication environment. Fourth, a turning on speed of the high positive voltage on the drain should be reasonably slow, otherwise an inrush current upon turning on the GaN power transistor will be very large, and it will destroy the GaN power transistor if ON/OFF is performed for several times. On the other hand, when the power amplifier is turned off, a turning off speed of the high positive voltage on the drain should be quick enough. Otherwise, the GaN power transistor may be easily damaged in the power-off stage if ON/OFF is performed for several times.

SUMMARY

In view of the above technical problems in the prior art, a purpose of embodiments of the present disclosure is to provide circuitry and a method for a GaN device so as to solve at least one of the technical problems in the prior art.

According to a first aspect of the present disclosure, circuitry for a GaN device is provided. The circuitry includes a negative bias circuit configured to provide a negative bias voltage for a gate of the GaN device; a drain switch circuit configured to turn on or off a positive voltage for a drain of the GaN device; and a control circuit configured to control the drain switch circuit based on provision of the negative bias, such that the positive voltage for the drain is turned on after a voltage of the gate reaches the negative bias voltage and turned off before the negative bias voltage completely disappears.

In some embodiments, the control circuit may be further configured to turn on the drain switch circuit when an output voltage of the negative bias circuit is decreased from a voltage of zero to a threshold voltage, and to turn off the drain switch circuit when the output voltage of the negative bias circuit is increased from the negative bias voltage to the threshold voltage, the threshold voltage being between the negative bias and the voltage of zero. In some embodiments, the control circuit may include at least one of a resistance divider circuit, a comparator circuit, and a Zener diode circuit. In some embodiments, the threshold voltage may be adjusted by program code when the control circuit includes the comparator circuit.

In some embodiments, the circuitry may further include a voltage holding circuit configured to hold the negative bias voltage for the gate of the GaN device for a predetermined period when the output voltage of the negative bias circuit begins to increase from the negative bias voltage. In some embodiments, the voltage holding circuit may include a capacitor circuit having a predetermined discharge time constant. In some embodiments, the predetermined period may be ranged from 1 ms to 2 ms.

In some embodiments, the negative bias circuit may include a negative switch power supply buck-boost circuit which may convert a power supply voltage into the negative bias voltage, and may provide a current required for an operation of the GaN device. In some embodiments, the current may be ranged from 300 mA to 500 mA.

In some embodiments, the drain switch circuit may be further configured to increase from a voltage of zero slowly at a first predetermined speed to the positive voltage for the drain when being turned on, and to decrease from the positive voltage for the drain quickly at a second predetermined speed to the voltage of zero when being turned off. In some embodiments, the drain switch circuit may include a capacitor to slow down the increasing and a switch to cause the capacitor to discharge quickly.

In some embodiments, the circuitry may further include a bias switch circuit connected between the negative bias circuit and the gate of the GaN device and configured to apply the output voltage of the negative bias circuit to the gate of the GaN device based on a control command. In some embodiments, the circuitry may further include a big capacitor having a predetermined large capacitance and connected between the drain of the GaN device and ground.

In some embodiments, the GaN device may operate as a GaN radio frequency power amplifier. In some embodiments, the negative bias voltage may be adjustable from −5V to −10V and the positive voltage for the drain is 48V.

According to a second aspect of the present disclosure, a method for a GaN device is provided. The method includes providing a negative bias voltage to a gate of the GaN device by decreasing a voltage of zero to the negative bias voltage; providing a positive voltage to a drain of the GaN device during the decreasing; turning off the negative bias voltage for the gate of the GaN device by increasing the negative bias voltage to the voltage of zero; and turning off the positive voltage for the drain of the GaN device during the increasing.

In some embodiments, providing the positive voltage to the drain of the GaN device during the decreasing may include providing the positive voltage to the drain of the GaN device when the voltage of zero is decreased to a threshold voltage, wherein the threshold voltage is between the negative bias voltage and the voltage of zero. In some embodiments, turning off the positive voltage for the drain of the GaN device during the increasing may include turning off the positive voltage for the drain of the GaN device when the negative bias voltage is increased to the threshold voltage, wherein the threshold voltage is between the negative bias and the voltage of zero.

In some embodiments, the method may further include providing the threshold voltage by at least one of a resistance divider circuit, a comparator circuit, and a Zener diode circuit. In some embodiments, the method may further include adjusting the threshold voltage by program code when the threshold voltage is provided by the comparator circuit.

In some embodiments, the method may further include holding the negative bias voltage for the gate of the GaN device for a predetermined period when the negative bias voltage begins to increase. In some embodiments, holding the negative bias voltage for the gate of the GaN device for the predetermined period may include holding the negative bias voltage by a capacitor circuit having a predetermined discharge time constant. In some embodiments, the predetermined period may be ranged from 1 ms to 2 ms.

In some embodiments, the method may further include implementing the decreasing and the increasing and providing a current required for an operation of the GaN device by a negative switch power supply buck-boost circuit. In some embodiments, the current may be ranged from 300 mA to 500 mA.

In some embodiments, providing the positive voltage to the drain of the GaN device during the decreasing may include providing the positive voltage to the drain of the GaN device by increasing from a voltage of zero slowly at a first predetermined speed to the positive voltage for the drain, and turning off the positive voltage for the drain of the GaN device by decreasing from the positive voltage for drain quickly at a second predetermined speed to the voltage of zero.

In some embodiments, the voltage of zero is increased slowly to the positive voltage for the drain by a capacitor for slowing down the increasing; and the positive voltage for the drain is decreased quickly to the voltage of zero by a switch for causing the capacitor to discharge quickly.

In some embodiments, the method may further include applying the negative bias voltage to the gate of the GaN device based on a control command. In some embodiments, the method may further include applying a big capacitor having a predetermined large capacitance value as a decoupling capacitor of the GaN device.

In some embodiments, the method may further include operating the GaN device as a GaN radio frequency power amplifier. In some embodiments, the negative bias voltage may be adjustable from −5V to −10V and the positive voltage for the drain may be 48V.

BRIEF DESCRIPTION OF THE DRAWINGS

Through the following detailed description with reference to the accompanying drawings, the above and other objectives, features, and advantages of example embodiments of the present disclosure will become more apparent. In the drawings, several embodiments of the present disclosure are illustrated exemplarily rather than restrictively, wherein.

DETAILED DESCRIPTION OF EMBODIMENTS

Figure 1:
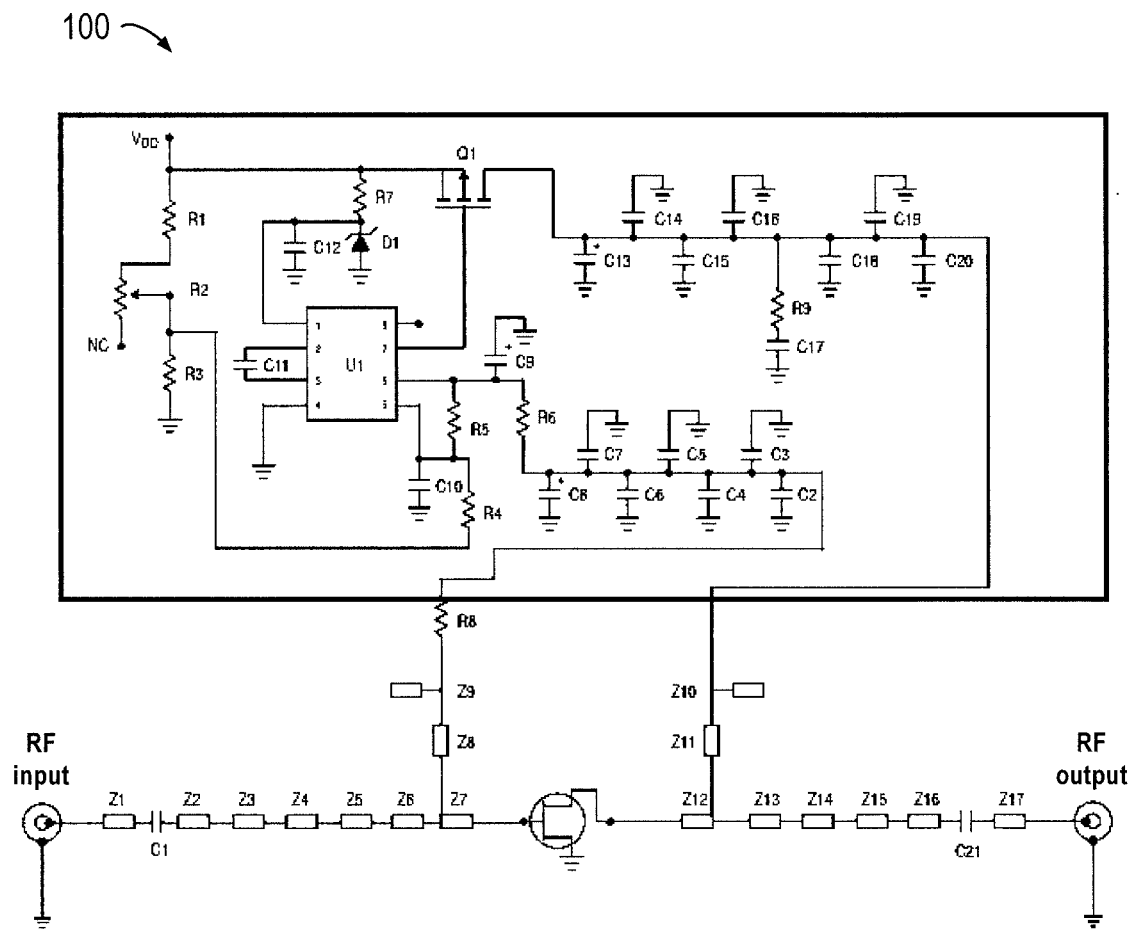
FIG. 1 schematically illustrates circuitry for a GaN radio frequency power amplifier according to prior art.

Principles and spirits of example embodiments disclosed herein will now be described with reference to various example embodiments illustrated in the drawings. It should be appreciated that description of those embodiments is merely to enable those skilled in the art to better understand and further implement the present disclosure and is not intended for limiting the scope disclosed herein in any manner.

FIG. 1 schematically illustrates circuitry 100 for a GaN radio frequency amplifier according to prior art. Despite enabling normal operations of a GaN device in general situations, the circuitry 100 still has the following drawbacks in practical applications.

First, the circuitry 100 uses a switching capacitor negative power supply circuit as the bias circuit whose output current is small, and this cannot satisfy requirements of certain technological scenarios, especially in a high RF power application scenario. In theory, a gate bias of the GaN device does not consume current, but in engineering practice, a certain amount of current is consumed and the current increases with increasing of the output power of the power amplifier. Hence, a switching capacitor regulator cannot be used in the high power amplifier field.

Second, in the circuitry 100, it is not easy to adjust a threshold for turning on the main power supply for the GaN RF power amplifier, because the negative voltage ready indicator is an internal IC of the switching capacitor. The relationship between the negative voltage ready indicator and the real negative bias voltage is not accurate. In a practical project, there is a need for an adjustable negative voltage ready indicator and an accurate threshold indicator indicating that the negative bias voltage is ready.

Third, a temperature drift of the switching capacitor negative circuit is relatively great in the circuitry 100, and cannot meet full temperature requirement of the high power amplifier. Fourth, the turning on speed and the turning off speed of the circuitry 100 cannot be controlled according to the requirements of the practical project.

Therefore, in view of the special sequencing requirements on the gate bias circuit and the drain high voltage of the GaN device as described above, as well as the drawbacks of the associated circuits in the prior art, embodiments of the present disclosure provide circuitry for a GaN device to solve at least one of these technical problems in the prior art.

Figure 2:
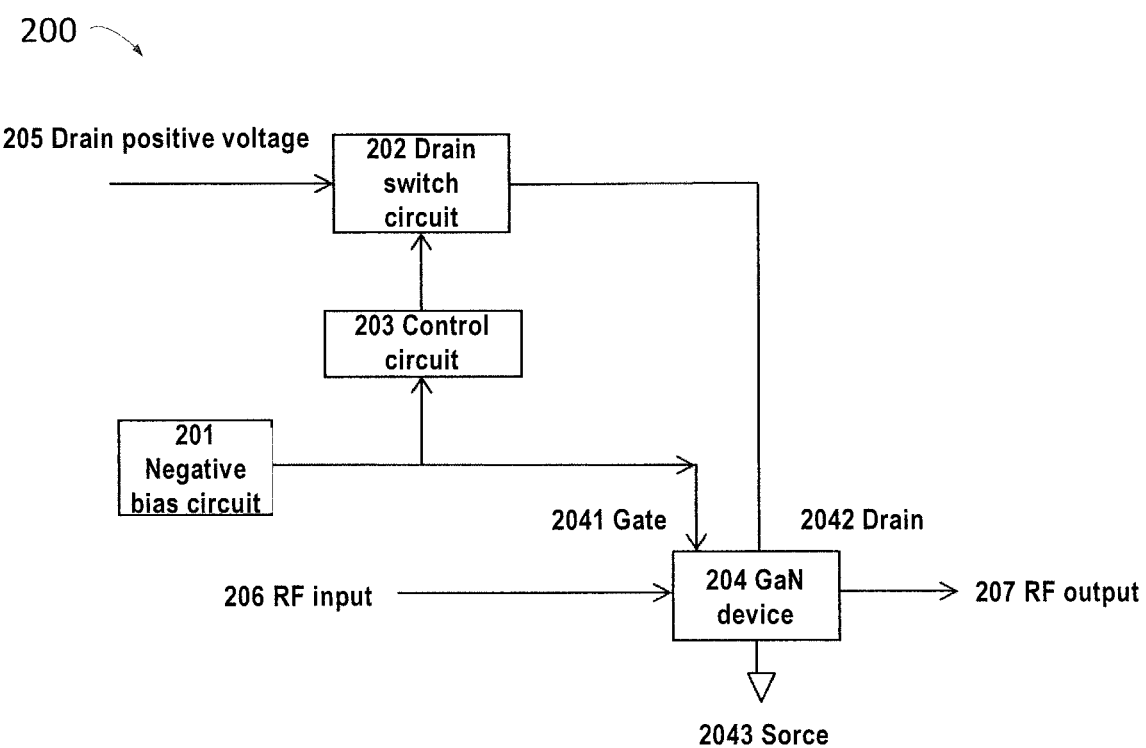
FIG. 2 schematically illustrates a block diagram of circuitry for a GaN device according to one embodiment of the present disclosure.

FIG. 2 is schematically illustrates a block diagram of circuitry 200 for a GaN device according to one embodiment of the present disclosure. It would be appreciated by those skilled in the art that FIG. 2 only shows units or components in the circuitry 200 which are closely related with the present disclosure. In practice, the circuitry 200 may include other functional units or components enabling its normal operation. Besides the connections as depicted in FIG. 2, there may be other connections between any two of the units or components as shown in FIG. 2 or with other units or components, but these connections are not depicted in FIG. 2 for brevity.

As shown in FIG. 2, the circuitry 200 for the GaN 204 includes a negative bias circuit 201, a drain switch circuit 202 and a control circuit 203. The negative bias circuit 201 provides to the gate 2041 of the GaN device 204 a negative bias voltage required for normal operations. A drain positive voltage 205 is connected via the drain switch circuit 202 to the drain 2042 of the GaN device 204. An RF input 206 and RF output 207 indicate that the GaN device 204 is performing power amplification on a RF signal. The source 2043 of the GaN device 204 may be grounded.

It should be appreciated that the depiction herein about the RF working state of the GaN device 204 is only an example scenario to which the embodiments of the present disclosure may be applied. The embodiments of the present disclosure may be used in other application scenarios of the GaN device, and the scope of the present disclosure is not limited by the depiction.

According to some embodiments of the present disclosure, the negative bias circuit 201 is configured to provide a gate negative bias of the GaN device 204. The drain switch circuit 202 is configured to turn on or off the drain positive voltage 205 of the GaN device 204. The control circuit 203 is configured to control the drain switch circuit 202 based on the provision of the negative bias, such that the drain positive voltage 205 is turned on after the gate voltage reaches the negative bias voltage and turned off before the negative bias voltage disappears completely. In this manner, the GaN device 204 is protected from being damaged during power-up and power-off.

It would be appreciated by those skilled in the art that there are various technical means to implement the above control functions of the control circuit 203. In some embodiments, the control circuit 203 may be further configured to turn on the drain switch circuit 202 when the output voltage of the negative bias circuit 201 is decreased from a voltage of zero to a threshold voltage, and to turn off the drain switch circuit 202 when the output voltage of the negative bias circuit 201 is boosted from the negative bias voltage to the threshold voltage, wherein the threshold voltage is between the negative voltage and the voltage of zero. Hereinafter, various embodiments of the control circuit 203 will be detailed referring to FIGS. 4-9. In these embodiments, the control circuit 203 may include at least one of a resistance divider circuit, a comparator circuit and a Zener diode circuit, wherein the threshold voltage may be adjusted by program code when the control circuit 203 includes a comparator circuit.

Figure 3:
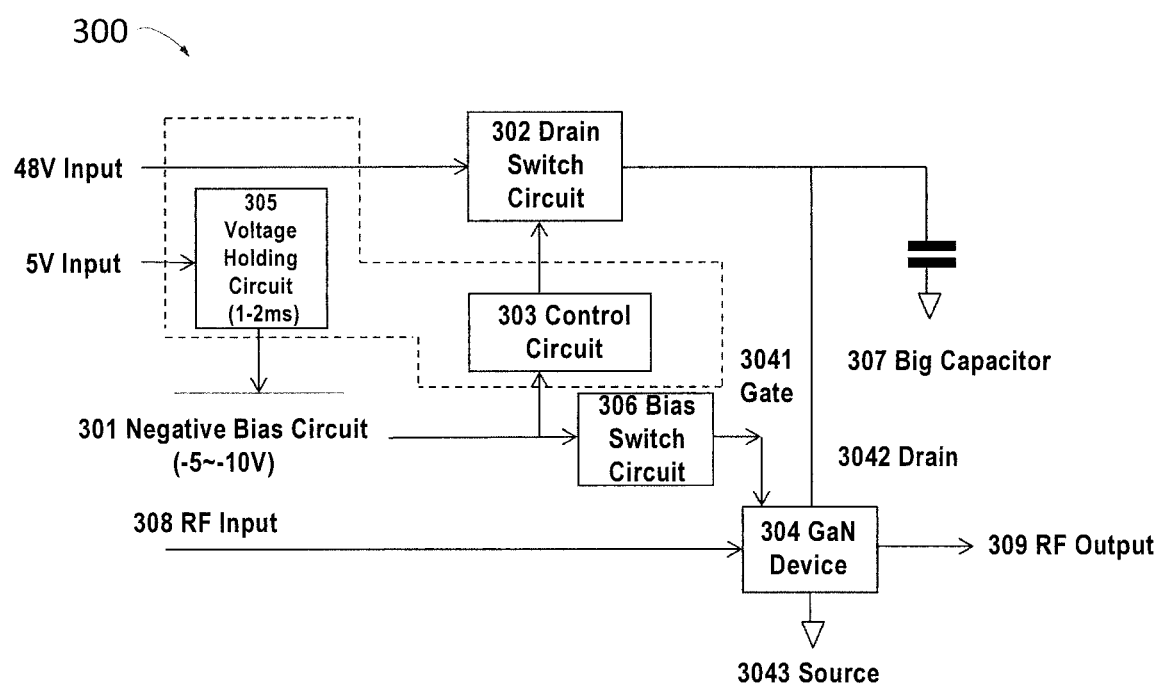
FIG. 3 schematically illustrates a block diagram of circuitry for a GaN device according to another embodiment of the present disclosure.

FIG. 3 is schematically illustrates a block diagram of circuitry 300 for a GaN device according to another embodiment of the present disclosure. It would be appreciated by those skilled in the art that FIG. 3 only shows units or components in the circuitry 300 which are closely related with the present disclosure. In practice, the circuitry 300 may include other functional units or components enabling its normal operation. Besides the connections as depicted in FIG. 3, there may be other connections between any two of the units or components as shown in FIG. 3 or with other units or components, but these connections are not depicted in FIG. 3 for brevity.

As shown in FIG. 3, the circuitry 300 for the GaN device 304 includes a negative bias circuit 301, a drain switch circuit 302 and a control circuit 303. Their basic functions are similar to those in FIG. 2 and therefore omitted herein. The circuitry 300 differs from the circuitry 200 in that it further includes a voltage holding circuit 305, a bias switch circuit 306 and a big capacitor 307. The big capacitor 307 has a predetermined large capacitance value which may be selected according to the actual technical environment and the design needs.

In some embodiments, the voltage holding circuit 305 may be configured to hold the negative bias voltage on the gate 3041 of the GaN device 304 for a predetermined period when the output voltage of the negative bias circuit 301 begins to increase from the negative bias voltage. In some embodiments, the voltage holding circuit 305 may include a capacitor circuit having a predetermined discharge time constant. The predetermined discharge time constant may be selected according to the actual technical environment and the design needs. In some embodiments, the predetermined period may be 1 to 2 milliseconds (ms). In this way, the voltage holding circuit 305 may prevent the GaN transistor from being damaged during shutdown of the power supply. Hereinafter, the embodiments of the voltage holding circuit 305 will be described in detail referring to FIGS. 12-13.

In some embodiments, the bias switch circuit 306 may be connected between the negative bias circuit 301 and the gate 3041 of the GaN device 304, and configured to apply the output voltage of the negative bias circuit 301 to the gate 3041 of the GaN device 304 based on a control command. In some embodiments, the control command, for example, may be given by other control units of the transceiver where the GaN device is located.

In some embodiments, the big capacitor 307 may be connected between the drain of the GaN device and the ground. The big capacitor 307 may be a decoupling capacitor of the GaN RF power transistor. In addition, when an input RF power envelope is changed, the big capacitor 307 may stabilize the power supply.

In some embodiments, the GaN device 304 may operate as a GaN RF power amplifier. For example, FIG. 3 shows an RF input 308 and RF output 309. In some embodiments, the negative bias voltage provided by the negative bias circuit 301 is adjustable between −5V and −10V, and the positive voltage on the drain may be 48V. In the GaN RF power amplifier circuit, the GaN device 304 is a core device of an efficient RF power amplifier. If the sequencing of the operations of the power supply circuit is inappropriate, the GaN device 304 is easily damaged in the power-up and power-off stages.

In some embodiments, the negative bias circuit 301 may include a negative switching mode power supply (SMPS) buck-boost circuit which may convert the power supply voltage (e.g. +5V) into a negative bias voltage, and may provide a current required for operation of the GaN device. In some embodiments, the current is from 300 to 500 mA.

In some embodiments, the drain switch circuit 302 may be further configured to increase slowly at a first predetermined speed from the voltage of zero to the positive voltage of the drain when switched on, and to decrease quickly at a second predetermined speed from the positive voltage of the drain to the voltage of zero. The first predetermined speed and the second predetermined speed may be selected according to the actual technical environment and the design needs. In some embodiments, the drain switch circuit 302 may include a capacitor to slow down the boosting and a switch to enable quick discharge of the capacitor. Hereinafter, the embodiments of the drain switch circuit 302 will be described in detail referring to FIGS. 10-11.

The drain switch circuit 302 is provided for controlling the turning on or turning off of the positive voltage for the drain based on the provision of the negative bias. In the power-up stage of the GaN device 304, the control circuit 303 determines whether the negative bias stably reaches a safe state (e.g. from 0V to −8V) based on a threshold, and then the control circuit 303 gradually turns on the drain switch circuit 302 and avoids occurrence of a large inrush current. In the power-off stage of the GaN device 304, when the negative bias voltage decreases from a work voltage to the threshold (e.g., from −10V to −8V), the control circuit 303 disconnects the drain switch circuit 302 as soon as possible. The control circuit 303 may cooperate with the voltage holding circuit 305 to ensure disconnection of the drain switch circuit 302 before the negative bias voltage disappears. In this way, the GaN device is protected safely in the power-off stage of the GaN device RF power amplifier.

Referring to FIGS. 4-9, various embodiments of the control circuits 203 and 303 according to the embodiments of the present disclosure will be described below in detail.

Figure 4:
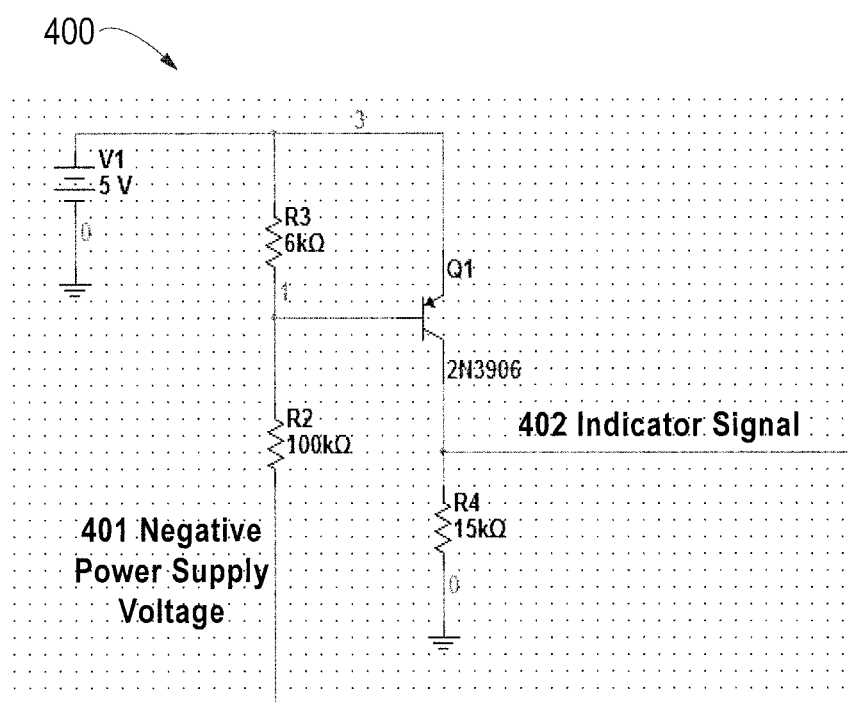
FIG. 4 schematically illustrates a control circuit of circuitry for a GaN device according to one embodiment of the present disclosure.

FIG. 4 schematically illustrates a control circuit 400 of circuitry for a GaN device according to one embodiment of the present disclosure. It would be appreciated by those skilled in the art that FIG. 4 only shows the circuit components in the control circuit 400 which are closely related with the embodiments of the present disclosure. In practice, the control circuit 400 may include other circuit components enabling its normal operation. Moreover, the type and value of each circuit component as shown in FIG. 4 are only examples, and the embodiments of the present disclosure may also be implemented by devices of other types and values.

As shown in FIG. 4, the control circuit 400 mainly includes a voltage divider circuit consisting of a triode Q1 and resistors R2-R4, wherein the negative power supply voltage 401 is connected from one terminal of the resistor R2, and a collector of the triode Q1 outputs an indicator signal 402, thereby serving as a control signal to control, for example, the drain switch circuits 202, 203 in FIGS. 2 and 3.

When the control circuit 400 is powered on, an initial output of the negative power supply voltage 401 (e.g. a negative SMPS) is zero voltage, the triode Q1 (e.g., a PNP transistor) is turned off, and the output indicator signal 402 is also zero. In the process in which the negative output voltage of the negative power supply voltage 401 is decreased to a target voltage (e.g. −10V), the negative voltage will reach a threshold (e.g. −8V). At this time, the indicator signal outputs 5V and, for example, the drain switch circuits 202, 203 in FIGS. 2 and 3 may be turned on, such that a high voltage of 48V can be applied to the drain of the GaN device. At power-off, in the process in which the negative power supply voltage 401 increases to the voltage of zero, it will also reach the threshold −8V. Then, the indicator signal 402 outputs zero voltage and, for example, the drain switch circuits 202, 203 in FIGS. 2 and 3 are turned off, such that the high voltage of 48V is disconnected as soon as possible.

The threshold voltage of the control circuit 400 may be calculated according to the following equation:

$$\frac{V_{supply} + |V_{threshold}|}{R_2 + R_3} * R_3 = 0.7 \text{ V},$$

wherein $V_{supply}$ is a positive power supply voltage of the control circuit 400, which is generally 5V, $V_{threshold}$ is a target negative voltage for turning on or turning off the drain switch circuit, and 0.7V is a PN junction voltage of the triode Q1 which should be adjusted according to a type of the transistor.

Figure 5:
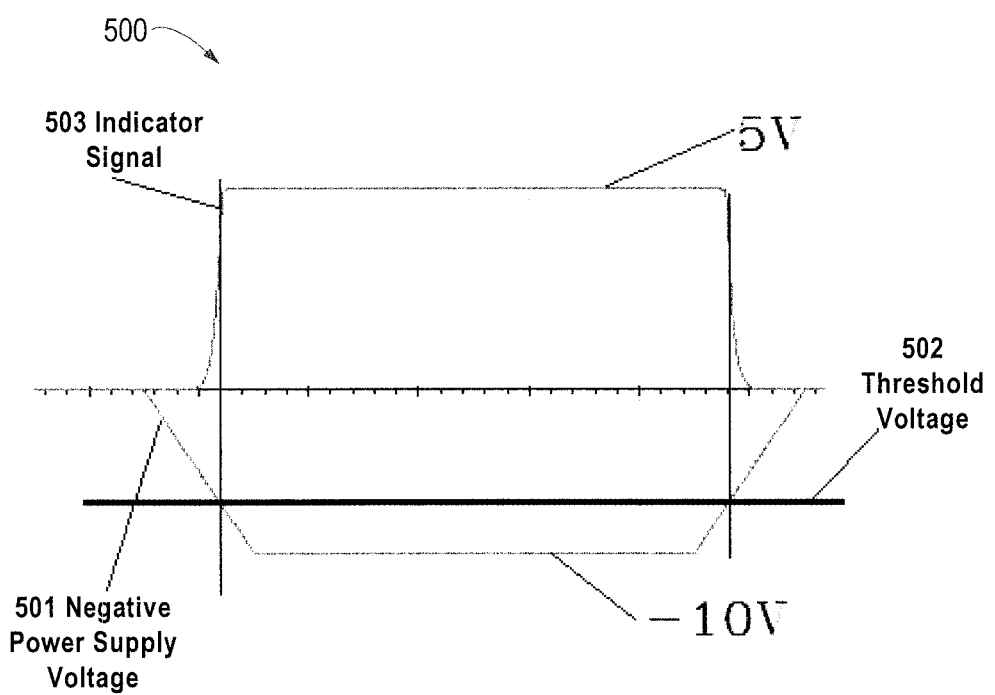
FIG. 5 schematically illustrates a working waveform of the control circuit in FIG. 4 according to the embodiment of the present disclosure.

FIG. 5 schematically illustrates a working waveform 500 of the control circuit in FIG. 4 according to embodiments of the present disclosure. As shown in FIG. 5, the reference sign 501 represents a waveform of the negative power supply voltage in the control circuit 400, the reference sign 502 represents a waveform of the threshold voltage in the control circuit 400, and the reference sign 503 represents a waveform of the negative power supply indicator 402 in the control circuit 400.

Figure 6:
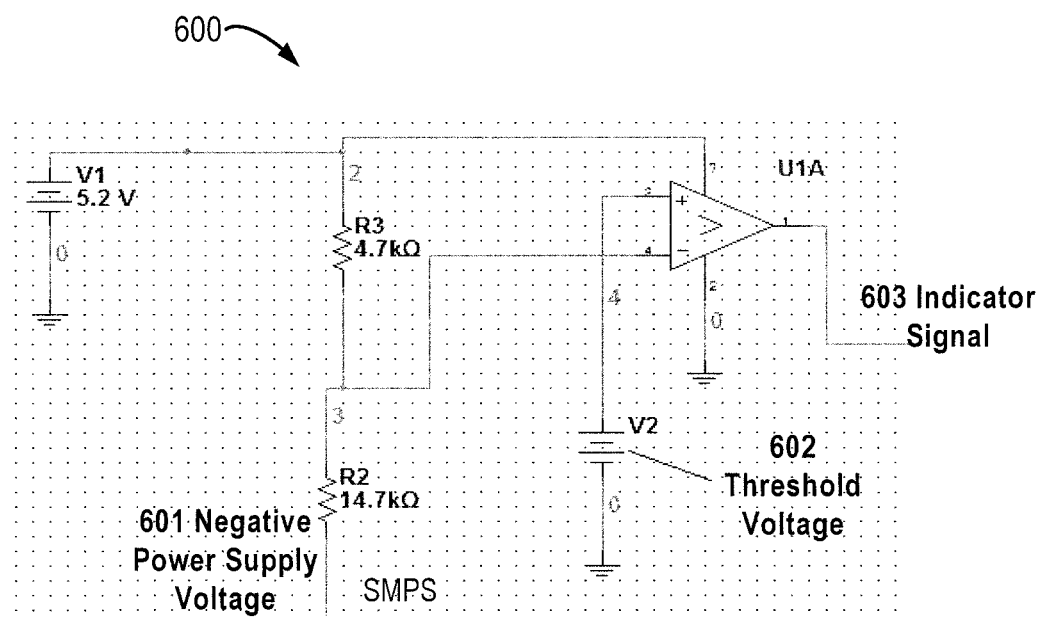
FIG. 6 schematically illustrates a control circuit of circuitry for a GaN device according to another embodiment of the present disclosure.

FIG. 6 schematically illustrates a control circuit 600 of circuitry of a GaN device according another embodiment of the present disclosure. It would be appreciated that FIG. 6 only shows the circuit components in the control circuit 600 which are closely related with the embodiments of the present disclosure. In practice, the control circuit 600 may include other circuit components enabling its normal operation. Moreover, the type and value of each circuit component as shown in FIG. 6 are only examples, and the embodiments of the present disclosure may also be implemented by devices of other types and values.

As shown in FIG. 6, the control circuit 600 mainly includes a comparator circuit consisting of an operational amplifier U1A and resistors R2-R3, wherein the negative power supply voltage 601 is connected from one terminal of the resistor R2, the threshold voltage is provided via V2, and the output of the operational amplifier U1A acts as an indicator signal 603 and thereby serves as a control signal to control, for example, the drain switch circuits 202, 203 in FIGS. 2 and 3. As compared to the control circuit 400 in FIG. 4, the control circuit 600 in FIG. 6 is capable of controlling the threshold by program code, but is relatively expensive.

Figure 7:
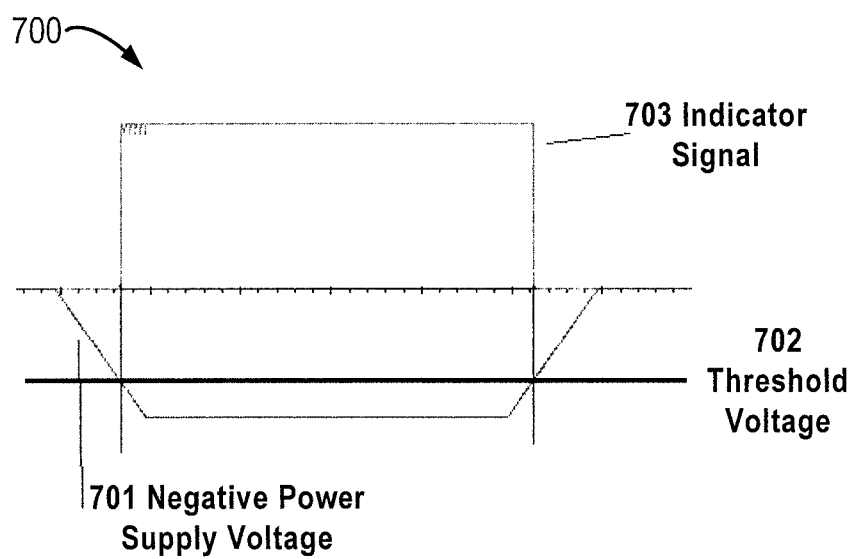
FIG. 7 schematically illustrates a working waveform of the control circuit in FIG. 6 according to the embodiment of the present disclosure.

FIG. 7 schematically illustrates a working waveform 700 of the control circuit in FIG. 6 according to embodiments of the present disclosure. As shown in FIG. 7, the reference sign 701 represents a waveform of the negative power supply voltage in the control circuit 600, the reference sign 702 represents a waveform of the threshold voltage in the control circuit 600, and the reference sign represents a waveform of the indicator signal in the control circuit 600.

Figure 8:
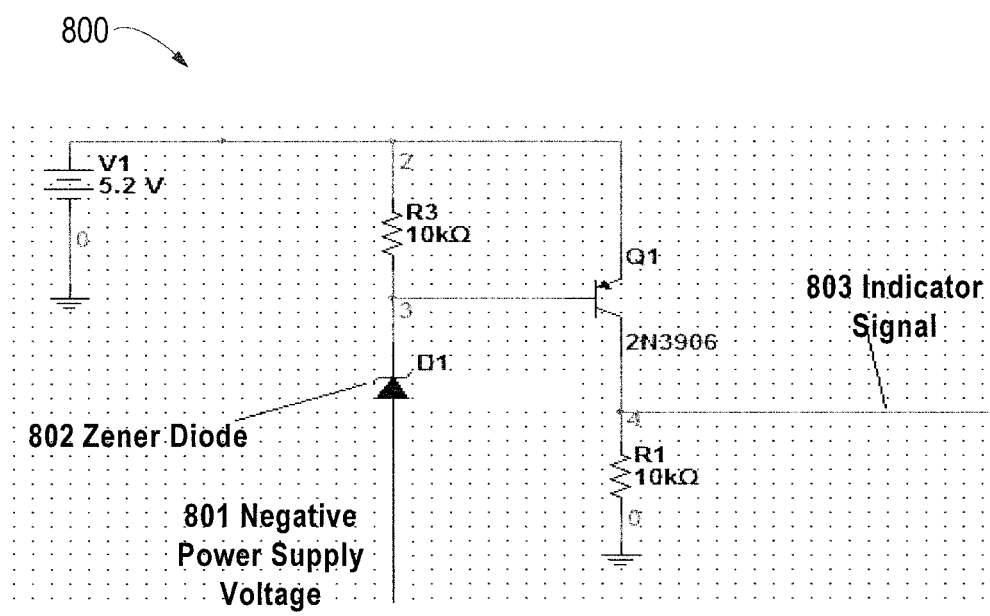
FIG. 8 schematically illustrates a control circuit of circuitry for a GaN device according to a further embodiment of the present disclosure.

FIG. 8 schematically illustrates a control circuit 800 of circuitry for a GaN device according to a further embodiment of the present disclosure. It would be appreciated by those skilled in the art that FIG. 8 only shows the circuit components in the control circuit 800 which are closely related with the embodiments of the present disclosure. In practice, the control circuit 800 may include other circuit components enabling its normal operation. Moreover, the type and value of each circuit component as shown in FIG. 8 are only examples, and the embodiments of the present disclosure may also be implemented by devices of other types and values.

As shown in FIG. 8, the control circuit 800 provides a threshold voltage mainly through a Zener diode 802, wherein the negative power supply voltage 801 is connected from the positive electrode of the Zener diode 802, and the output of the triode Q1 acts as an indicator signal 803 and thereby serves as a control signal to control, for example, the drain switch circuits 202, 203 in FIGS. 2 and 3. As compared to the control circuit 600 in FIG. 6, the control circuit 800 in FIG. 8 is simpler, and the voltage threshold may be adjusted by a corresponding Zener diode. In this regard, the Zener diode may be selected according to the following equation: $V_{supply}+|V_{threshold}|-V_{zener\_diode}>0$, wherein $V_{supply}$ is a positive power supply voltage of the circuit, $V_{threshold}$ is a target voltage for turning on or turning off the drain switch circuit, and $V_{zener\_diode}$ is a breakthrough voltage of the selected Zener diode.

Figure 9:
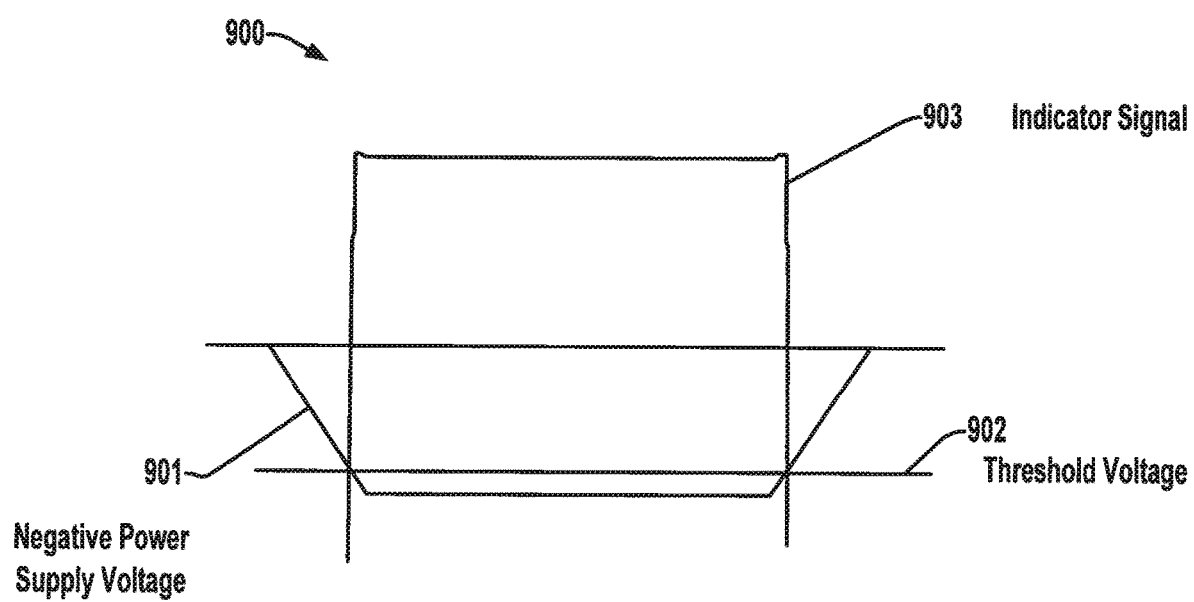
FIG. 9 schematically illustrates a working waveform of the control circuit in FIG. 8 according to the embodiment of the present disclosure.

FIG. 9 schematically illustrates a working waveform 900 of the control circuit in FIG. 8 according to embodiments of the present disclosure. As shown in FIG. 9, the reference sign 901 represents a waveform of the negative power supply voltage in the control circuit 800, the reference sign 902 represents a waveform of the threshold voltage in the control circuit 800, and the reference sign 903 represents a waveform of the indicator signal in the control circuit 800.

Figure 10:
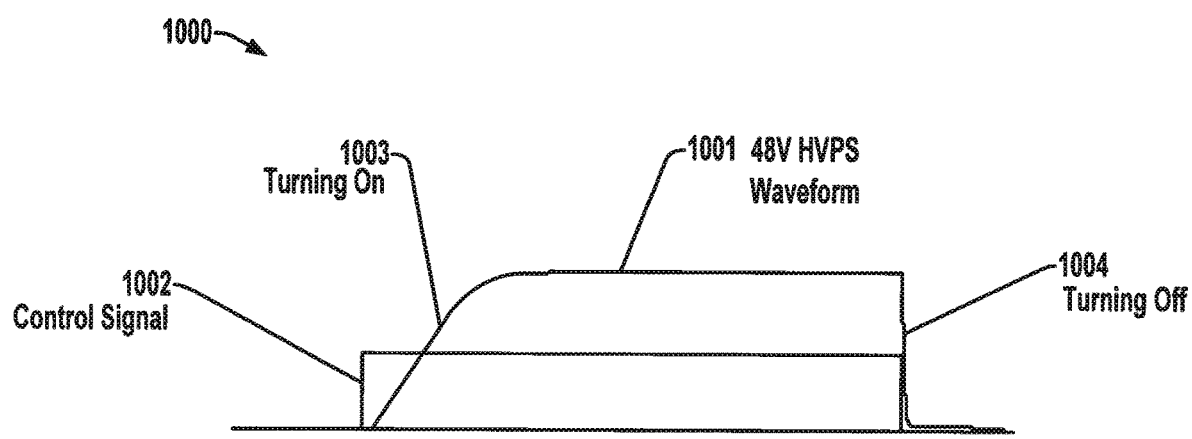
FIG. 10 schematically illustrates a working waveform of a negative bias circuit of circuitry for a GaN device according to one embodiment of the present disclosure.
Figure 11:
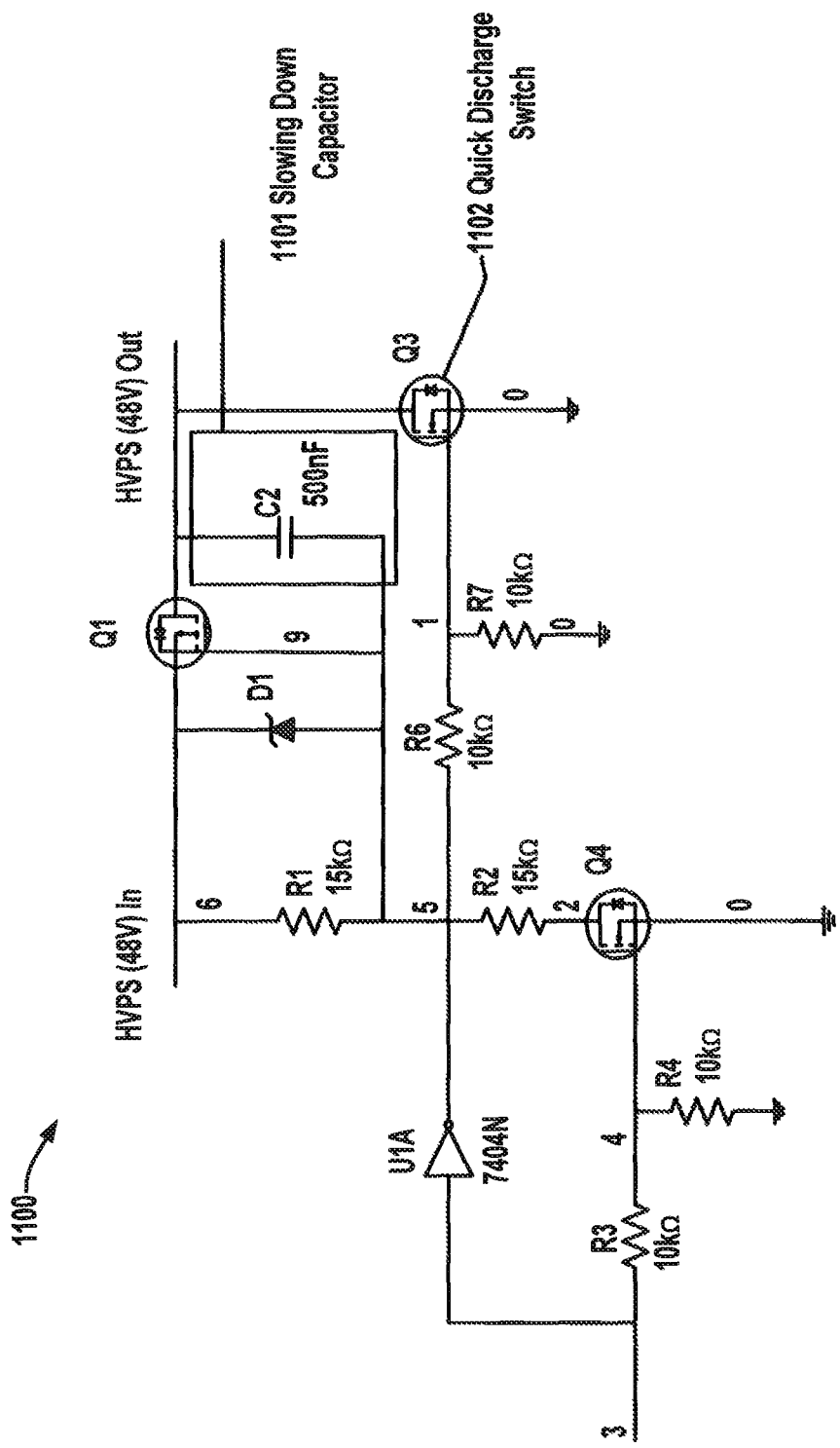
FIG. 11 schematically illustrates a negative bias circuit of circuitry for a GaN device according to one embodiment of the present disclosure.

Referring to FIGS. 10-11, an example of the negative bias circuits 202 and 302 is described according to embodiments of the present disclosure. FIG. 10 schematically illustrates a working waveform 1000 of a negative bias circuit of circuitry for a GaN device according to one embodiment of the present disclosure.

Generally, a drain switch circuit may be a high voltage p channel MOSFET. However, for a RF power amplifier, in a vicinity of the RF power transistor may be a big decoupling capacitor. Therefore, in the stage of turning on the GaN device, the switching speed is desired to be sufficiently slow. Otherwise, the big capacitor will generate a large inrush current when the drain switch circuit is turned on. However, in the stage of turning off the GaN device, the switching speed is desired to be sufficiently quick. If the switching speed is not sufficiently quick, the RF power transistor of the GaN device is easily damaged. Accordingly, in some embodiments, the drain of the GaN RF power amplifier needs a high voltage power supply working waveform 1000 as shown in FIG. 10.

FIG. 11 schematically illustrates a negative bias circuit 1100 of circuitry for a GaN device according to one embodiment of the present disclosure. It would be appreciated by those skilled in the art that FIG. 11 only shows the circuit components in the negative bias circuit 1100 which are closely related with the embodiments of the present disclosure. In practice, the negative bias circuit 1100 may include other circuit components enabling its normal operation. Moreover, the type and value of each circuit component as shown in FIG. 11 are only examples, and the embodiments of the present disclosure may also be implemented by devices of other types and values.

With the negative bias circuit 1100, in the power-up stage of the GaN device, the high voltage power supply HVPS of 48V may slowly reach a target voltage (such as 48V) to avoid an inrush current resulting from the big decoupling capacitor. In the power-off stage of the GaN device, the high voltage power supply HVPS of 48V may reach zero voltage as soon as possible to avoid damage to the GaN RF power transistor. As shown in FIG. 11, the negative bias circuit 1100 satisfies this requirement mainly using a slow-down capacitor 1101 and a fast discharge switch 1102.

Figure 12:
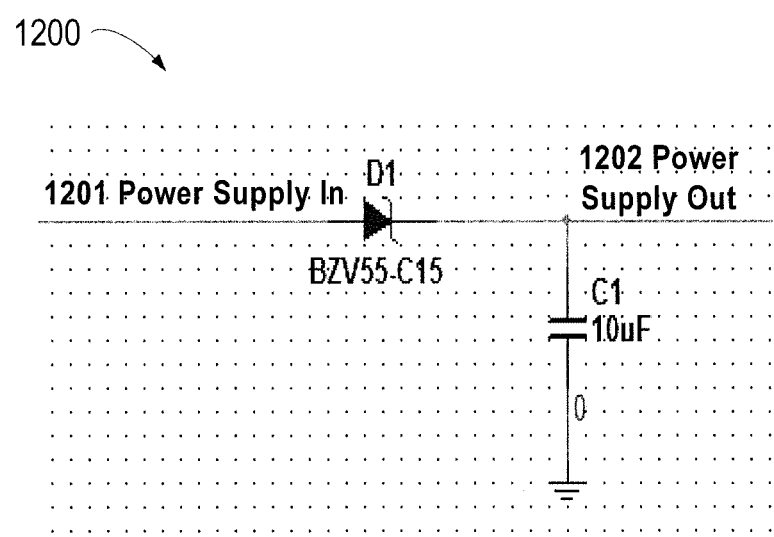
FIG. 12 schematically illustrates a voltage holding circuit of circuitry for a GaN device according to one embodiment of the present disclosure.
Figure 13:
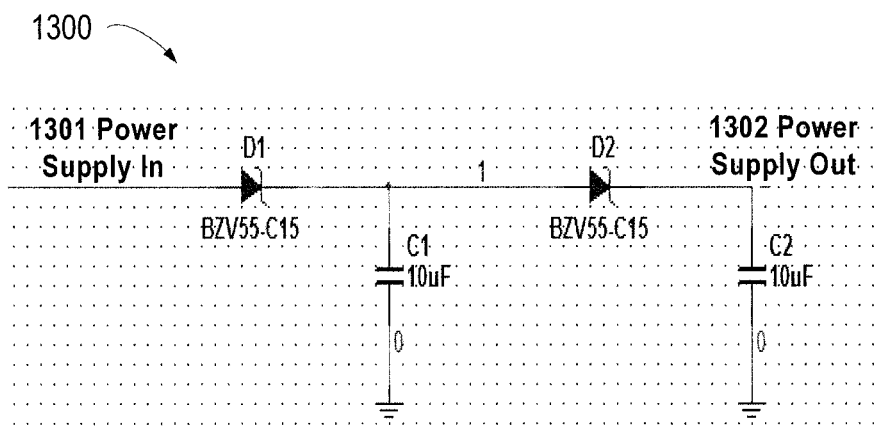
FIG. 13 schematically illustrates a voltage holding circuit of circuitry for a GaN device according to another embodiment of the present disclosure.

Referring to FIGS. 12-13, several embodiments of the voltage holding circuit 305 according to embodiments of the present disclosure will be described below. FIG. 12 schematically illustrates a voltage holding circuit 1200 of circuitry for a GaN device according to one embodiment of the present disclosure. It would be appreciated by those skilled in the art that FIG. 12 only shows the circuit components in the voltage holding circuit 1200 which are closely related with the embodiments of the present disclosure. In practice, the voltage holding circuit 1200 may include other circuit components enabling its normal operation. Moreover, the type and value of each circuit component as shown in FIG. 12 are only examples, and the embodiments of the present disclosure may also be implemented by devices of other types and values.

As shown in FIG. 12, the voltage holding circuit 1200 may include a diode D1 and a capacitor C1. When the GaN device is powered on, a power supply voltage may be fed to a negative bias circuit (e.g. a negative SMPS circuit) and the capacitor C is charged in the meantime. When the GaN device is powered off, the capacitor C1 discharges slowly because the reverse bias diode D1 has very high impedance. The discharge time constant mainly depends on a consuming current of the negative SMPS circuit.

FIG. 13 schematically illustrates a voltage holding circuit 1300 of circuitry for a GaN device according to another embodiment of the present disclosure. It would be appreciated by those skilled in the art that FIG. 13 only shows the circuit components in the voltage holding circuit 1300 which are closely related with the embodiments of the present disclosure. In practice, the voltage holding circuit 1300 may include other circuit components enabling its normal operation. Moreover, the type and value of each circuit component as shown in FIG. 13 are only examples, and the embodiments of the present disclosure may also be implemented by devices of other types and values. As compared to the voltage holding circuit 1200 in FIG. 12, the voltage holding circuit 1300 as shown in FIG. 13 achieves a better performance by two stages of diodes D1 and D2, as well as capacitors C1 and C2.

Figure 14:
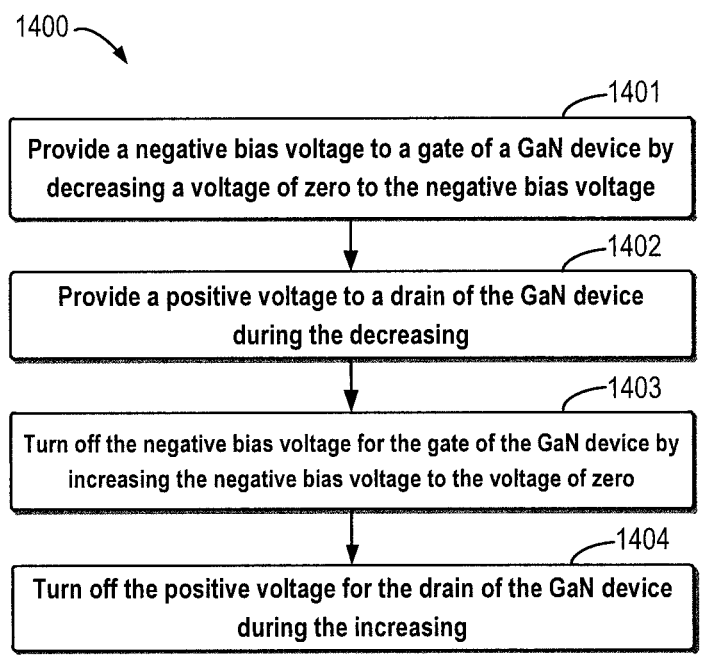
FIG. 14 schematically illustrates a flow chart of a method for a GaN device according to one embodiment of the present disclosure.

FIG. 14 schematically illustrates a flow chart of a method 1400 for a GaN device according to one embodiment of the present disclosure. In some embodiments, the method 1400 may be performed by the circuitry 200 or 300 for a GaN device as described above, wherein each unit or component in the circuitry 200 or 300 may be configured to perform a corresponding block or operation in the method 1400.

As shown in FIG. 14, the method 1400 for a GaN device includes blocks 1401 to 1404. In the block 1401, a negative bias voltage is provided to a gate of the GaN device by decreasing from zero voltage to the negative bias voltage. In the block 1402, a positive voltage is provided to a drain of the GaN device during the voltage-decreasing process. In the block 1403, the negative bias voltage for the gate of the GaN device is turned off by increasing from the negative bias voltage to the zero voltage. In the block 1404, the positive voltage for the drain of the GaN device is turned off during the voltage-increasing process. By implementing the method 1400, the GaN device is safely protected in the power-up and power-off stages of the GaN device.

Specifically, in an application where the GaN device is used as a GaN power amplifier, turning-on and turning-off thereof may be implemented as follows. The turning-on process of the GaN power amplifier: at power-up, the gate voltage power supply reduces voltage from zero voltage to a negative voltage to supply power to the gate of the GaN; in the voltage-decreasing process, when the negative voltage is reduced to a predetermined threshold, the power supply switch for the drain of the GaN is turned on to supply power to the drain of the GaN; and then the radio frequency signal is switched on.

The turning-off process of the GaN power amplifier: the radio frequency signal is switched off; at power-off, the gate voltage power supply is boosted from the negative voltage to the zero voltage; when the negative voltage is boosted to the predetermined threshold, the drain voltage of the GaN power amplifier is turned off; the turning off is a process in which there is a need to ensure that the speed of returning the drain voltage to the zero voltage is faster than the speed of returning the gate voltage to the zero voltage, thereby ensuring safety of the GaN power amplifier.

In some embodiments, the block 1402 may include providing the positive voltage to the drain of the GaN device when the zero voltage is decreased to a threshold voltage, wherein the threshold voltage is between the negative bias voltage and the zero voltage. In some embodiments, the block 1403 may include turning off the positive voltage for the drain of the GaN device when the negative bias voltage is increased to the threshold voltage, wherein the threshold voltage is between the negative bias voltage and the zero voltage. In this way, the method 1400 uses a simple but unique threshold to control power supply sequencing of the GaN device, and the threshold may be adjusted according to different technical environments, thereby being more flexible.

In some embodiments, the method 1400 may further include providing the threshold voltage by a resistance divider circuit, a comparator circuit or a Zener diode circuit. In some embodiments, the method 1400 may further include adjusting the threshold voltage by program code when the threshold voltage is provided by the comparator circuit.

In some embodiments, the method 1400 may further include holding the negative bias voltage for the gate of the GaN device for a predetermined period when the negative bias voltage begins to increase. In some embodiments, holding the negative bias voltage for the gate of the GaN device for the predetermined period includes holding the negative bias voltage by a capacitor having a predetermined discharge time constant. In some embodiments, the predetermined period may be ranged from 1 ms to 2 ms.

In some embodiments, the method 1400 may further include implementing the voltage-decreasing and voltage-increasing and providing a current required for an operation of the GaN device by a negative switch power supply boost-buck circuit. In some embodiments, the current may be ranged from 300 mA to 500 mA. By this way, the boost-buck negative switch power supply SMPS is used in the method 1400 to replace the switching capacitor used in the prior art, which has a better current capability and a more stable temperature performance than the switching capacitor.

In some embodiments, providing the positive voltage to the drain of the GaN device during the voltage-decreasing process may include providing the positive voltage to the drain of the GaN device by increasing from the zero voltage slowly at a first predetermined speed to the positive voltage for the drain, and turning off the positive voltage for the drain of the GaN device by decreasing from the positive voltage for the drain quickly at a second predetermined speed to the zero voltage.

In some embodiments, the method 1400 may further include slowly increasing the zero voltage to the positive voltage for the drain by a capacitor for slowing down the voltage-increasing; and quickly decreasing the positive voltage for the drain to the zero voltage by a switch enabling a quick discharge of the capacitor. In this manner, the method 1400 may slow down the turning-on speed of the high voltage for the drain when the GaN device is powered on, with an intention to reduce an inrush current of the GaN device upon turning on, and may speed up disconnecting the high voltage for the drain of the GaN device upon turning off.

In some embodiments, the method 1400 may further include applying the negative bias voltage to the gate of the GaN device based on a control command. In some embodiments, the method 1400 may further include applying a big capacitor having a predetermined large capacitance value as a decoupling capacitor of the GaN device.

In some embodiments, the method 1400 may further include operating the GaN device as a GaN radio frequency power amplifier. In some embodiments, the negative bias voltage is adjustable from −5V to −10V and the positive voltage for the drain may be 48V.

To sum up, embodiments of the present disclosure solve the problem of protecting the GaN RF power amplifier. For the GaN RF power amplifier, the power supply sequence protection is an important topic in the practical project design, and a good protection circuit enables the GaN RF power amplifier to operate safely. Especially when the GaN RF power amplifier is powered on or off, the GaN device is usually destroyed because of a poor power supply sequence protection circuit.

Different from the circuitry for the GaN radio frequency power amplifier in the prior art, embodiments of the present disclosure provide novel circuitry and method for a GaN device, mainly having the following technical advantages. First, a simple but unique threshold is used to control power supply sequencing of the GaN power amplifier, and the threshold can be adjusted according to different technical environments, thereby being more flexible.

Second, a buck-boost negative switch power supply SMPS is used to replace the switching capacitor in the prior art, which has a better current capacity and a more stable temperature performance than the switching capacitor. Third, using a zero voltage switch (ZVS) to boost or decrease the voltage of SMPS causes smaller bias ripples than using the switching capacitor. In this regard, it is noted that the negative bias voltage has much influence on the system digital pre-distortion performance, which is critical to the total transmitting system of the mobile RHH. Fourth, a charge capacitor is used to slow down the switching speed of the high voltage drain switch, with an intention of reducing an inrush current of the GaN power amplifier upon turning on, and an additional discharge switch is used to accelerate disconnection of the high voltage drain switch of the GaN power amplifier.

As compared to the prior art, the embodiments of the present disclosure have the advantage of being simple and more flexible, and simultaneously achieve the benefits, such as the adjustable threshold, slow power-on but quick power-off, etc. Moreover, using the voltage holding circuit solves the problem that the GaN power amplifier is easily damaged at power-off. The embodiments of the present disclosure may be used in a novel wideband power amplifier based on the GaN, and the wideband GaN RF power amplifier has a wide application in the wideband RRH, etc.

As used herein, the term "includes" and its variants are to be read as open-ended terms that mean "includes, but is not limited to." The term "based on" is to be read as "based at least in part on." The term "one example embodiment" and "an example embodiment" are to be read as "at least one example embodiment."

It will be noted that the embodiments of the present disclosure can be implemented in software, hardware, or a combination thereof. The hardware part can be implemented by a special logic; the software part can be stored in a memory and executed by a suitable instruction execution system such as a microprocessor or a special purpose hardware. Those skilled in the art may understand that the above apparatus and method may be implemented with computer executable instructions and/or in processor-controlled code, for example, such code is provided on a programmable memory or a carrier medium such as an optical or electronic signal carrier.

Further, although operations of the present methods are described in a particular order in the drawings, it does not require or imply that these operations are necessarily performed according to this particular sequence, or a desired outcome can only be achieved by performing all shown operations. On the contrary, the execution order for the blocks as depicted in the flowcharts may be varied. Alternatively, or in addition, some blocks may be omitted, a plurality of blocks may be merged into one block, or a block may be divided into a plurality of blocks for execution. It will be also noted that the features and functions of two or more devices according to the embodiments of the present invention may be embodied in one device. In turn, the features and functions of one device described above may be further embodied in more devices.

Although the present disclosure has been described with reference to various embodiments, it should be understood that the present disclosure is not limited to the disclosed embodiments. The present disclosure is intended to cover various modifications and equivalent arrangements included in the spirit and scope of the appended claims.

We claim:

1. Circuitry for a gallium nitride (GaN) device, comprising:
a negative bias circuit configured to provide a negative bias voltage for a gate of the GaN device;
a drain switch circuit configured to turn on or off a positive voltage for a drain of the GaN device; and
a control circuit configured to control the drain switch circuit based on provision of the negative bias voltage, such that the positive voltage for the drain is turned on after a voltage of the gate reaches the negative bias voltage and turned off before the negative bias voltage completely disappears.

2. The circuitry according to claim 1, wherein the control circuit is further configured to:
turn on the drain switch circuit when an output voltage of the negative bias circuit is decreased from a voltage of zero to a threshold voltage, and
turn off the drain switch circuit when the output voltage of the negative bias circuit is increased from the negative bias voltage to the threshold voltage,
the threshold voltage being between the negative bias voltage and the voltage of zero.

3. The circuitry according to claim 2, wherein the control circuit includes at least one of a resistance divider circuit, a comparator circuit, and a Zener diode circuit.

4. The circuitry according to claim 1, further comprising:
a voltage holding circuit configured to hold the negative bias voltage for the gate of the GaN device for a predetermined period when the output voltage of the negative bias circuit begins to increase from the negative bias voltage.

5. The circuitry according to claim 1, wherein the negative bias circuit includes a negative switch power supply buck-boost circuit, the negative switch power supply buck-boost circuit converting a power supply voltage into the negative bias voltage and providing a current required for an operation of the GaN device.

6. The circuitry according to claim 1, wherein the drain switch circuit is further configured to increase from a voltage of zero slowly at a first predetermined speed to the positive voltage for the drain when being turned on, and to decrease from the positive voltage for the drain quickly at a second predetermined speed to the voltage of zero when being turned off.

7. The circuitry according to claim 1, further comprising:
a bias switch circuit connected between the negative bias circuit and the gate of the GaN device and configured to apply an output voltage of the negative bias circuit to the gate of the GaN device based on a control command.

8. The circuitry according to claim 1, further comprising:
a big capacitor having a predetermined large capacitance and connected between the drain of the GaN device and ground.

9. A method for controlling a gallium nitride (GaN) device, comprising:
providing a negative bias voltage to a gate of the GaN device by decreasing a voltage of zero to the negative bias voltage;
turning on or off a positive voltage to a drain of the GaN device during the decreasing;
controlling the turning on of the positive voltage to the drain of the GaN device based on provision of the negative bias voltage to the gate, such that the positive voltage to the drain is turned on after the negative bias voltage is provided to the gate and after an actual voltage at the gate approaches the negative bias voltage;
removing the negative bias voltage from the gate of the GaN device by increasing the negative bias voltage to the voltage of zero; and
controlling the turning off of the positive voltage to the drain of the GaN device based on removal of the negative bias voltage from the gate, such that the positive voltage to the drain is turned off after the negative bias voltage is removed from the gate and before the actual voltage at the gate approaches the voltage of zero.

10. The method according to claim 9, wherein the turning on of the positive voltage to the drain of the GaN device during the decreasing of the negative bias voltage comprises:
providing the positive voltage to the drain of the GaN device when the voltage of zero is decreased to a threshold voltage, the threshold voltage being between the negative bias voltage and the voltage of zero.

11. The method according to claim 9, wherein the turning off of the positive voltage to the drain of the GaN device during the increasing of the negative bias voltage comprises:
turning off the positive voltage for the drain of the GaN device when the negative bias voltage is increased to a threshold voltage.

12. The method according to claim 9, further comprising:
holding the negative bias voltage for the gate of the GaN device for a predetermined period when the negative bias voltage begins to increase.

13. The method according to claim 9, wherein the decreasing and the increasing of the negative bias voltage are performed by a negative switch power supply buck-boost circuit, and the method further comprising:
providing a current required for an operation of the GaN device by the negative switch power supply buck-boost circuit.

14. The method according to claim 9, wherein providing the positive voltage to the drain of the GaN device during the decreasing of the negative bias voltage comprises:
turning on the positive voltage to the drain of the GaN device by increasing a voltage of zero slowly at a first predetermined speed to the positive voltage for the drain; and
turning off the positive voltage to the drain of the GaN device by decreasing the positive voltage to the drain quickly at a second predetermined speed to the voltage of zero.

15. The method according to claim 9, further comprising:
applying a big capacitor having a predetermined large capacitance as a decoupling capacitor of the GaN device.

16. The circuitry according to claim 1, wherein the GaN device operates as a GaN radio frequency power amplifier.

17. The circuitry according to claim 1, wherein the negative bias voltage is adjustable from −5 V to −10 V and the positive voltage for the drain is 48 V.

18. The method according to claim 10, further comprising:
providing the threshold voltage by at least one of a resistance divider circuit, a comparator circuit, and a Zener diode circuit.

19. The method according to claim 9, further comprising:
applying the negative bias voltage to the gate of the GaN device based on a control command.

20. The method according to claim 9, wherein the negative bias voltage is adjustable from −5 V to −10 V and the positive voltage for the drain is 48 V.

* * * * *